(12) United States Patent
Blanchon et al.

(10) Patent No.: US 11,882,373 B2
(45) Date of Patent: Jan. 23, 2024

(54) MATRIX DETECTOR WITH REDUCED ODD/EVEN EFFECT

(71) Applicant: ISORG, Limoges (FR)

(72) Inventors: David Blanchon, Grenoble (FR); Richun Fei, Grenoble (FR)

(73) Assignee: ISORG, Limoges (FR)

(*) Notice: Subject to any disclaimer, the term of this patent is extended or adjusted under 35 U.S.C. 154(b) by 339 days.

(21) Appl. No.: 17/429,903

(22) PCT Filed: Feb. 6, 2020

(86) PCT No.: PCT/EP2020/053024
§ 371 (c)(1),
(2) Date: Aug. 10, 2021

(87) PCT Pub. No.: WO2020/165024
PCT Pub. Date: Aug. 20, 2020

(65) Prior Publication Data
US 2022/0191415 A1 Jun. 16, 2022

(30) Foreign Application Priority Data
Feb. 11, 2019 (FR) ...................................... 19/01328

(51) Int. Cl.
*H04N 25/74* (2023.01)
*G11C 19/28* (2006.01)

(52) U.S. Cl.
CPC ............. *H04N 25/74* (2023.01); *G11C 19/28* (2013.01)

(58) Field of Classification Search
CPC ....... H04N 25/74; H04N 25/745; G11C 19/28
See application file for complete search history.

(56) References Cited

U.S. PATENT DOCUMENTS

| 6,556,646 B1* | 4/2003 | Yeo ...................... G09G 3/3677 |
| | | 377/64 |
| 7,053,945 B1* | 5/2006 | Xue ................. H03K 19/01707 |
| | | 327/390 |

(Continued)

FOREIGN PATENT DOCUMENTS

FR 2975213 A1 11/2012

OTHER PUBLICATIONS

Authorized Officer: Lauri, Lauro, International Search Report issued in corresponding PCT application No. PCT/EP2020/053024, dated Jun. 12, 2020, 2 pp.

*Primary Examiner* — Jason A Flohre
(74) *Attorney, Agent, or Firm* — Kaplan Breyer Schwarz, LLP

(57) ABSTRACT

A matrix-array detector having: an array of pixels arranged in a matrix along rows and down columns, each pixel for generating a signal according to a physical effect; a signal generator for generating two clock signals that are phase-shifted relative to one another; and a row-addressing device including a shift register, the shift register including a plurality of stages arranged in a cascade, each stage for receiving, in alternation from one stage to another, one clock signal from the two clock signals, and delivering an intermediate output signal that takes a high value and a low value allowing the pixels of the row to be activated and to be deactivated, respectively. The signal generator is also for generating a third clock signal. The addressing device further includes a plurality of isolation circuits, each isolation circuit connected between each stage and the corresponding row of the matrix, for receiving the third clock signal, the isolation circuit also for delivering a selection signal for selecting the corresponding row of the matrix when the (Continued)

intermediate output signal and the third clock signal are at the high level.

5 Claims, 4 Drawing Sheets

(56) References Cited

U.S. PATENT DOCUMENTS

| | | | |
|---|---|---|---|
| 2011/0228893 A1* | 9/2011 | Tobita | G11C 19/28 377/77 |
| 2013/0088265 A1 | 4/2013 | Chen | |
| 2013/0328612 A1 | 12/2013 | Ofuji et al. | |
| 2020/0035316 A1* | 1/2020 | Feng | G11C 19/28 |
| 2021/0335198 A1* | 10/2021 | Feng | G09G 3/3266 |

* cited by examiner

MATRIX DETECTOR WITH REDUCED ODD/EVEN EFFECT

TECHNICAL FIELD

The invention relates to a matrix-array detector, in which the effects of parasitic capacitances due to different clock signals are decreased. The invention is applicable in particular to sensors capable of detecting a signal according to a physical effect, and in particular to image sensors.

BACKGROUND ART

Matrix-array detectors are, in a known manner, composed of pixels, formed where the rows and columns of a matrix intersect. FIG. 1 illustrates the arrangement of the pixels of a detector in rows and columns. Each pixel P(i,j) consists of a light sensor D(i,j), generally a photodiode, that generates charge in proportion to the received light energy and stores said charge in its capacitor, and a switching device T(i,j), the source of which is connected to the charge detector D(i,j). In particular, the switching device may be a thin-film transistor T(i,j).

Sequentially addressing the rows L(i) requires providing two distinct voltages: one voltage Voff for keeping all of the transistors T(i,j) of a row L(i) in the off state and one voltage Von for putting all of the transistors T(i,j) of a row L(i) into the on state. The transistors T(i,j) are addressed by a selection token. The selection token is a high-level signal (voltage Von) for a predetermined time, in comparison with a low level (voltage Voff lower than Von), that propagates from row to row, in a given direction, for example from the row L(i) to the row L(i+1).

At the time when the selection token is propagating through a row L(i), the high level of the token commands the on state of all of the transistors of the row. The high level of the selection token is configured to have a value greater than the threshold voltage of the transistors. The electrons stored in each of the charge detectors D(i,j) of the row are transmitted to a charge integrator via a column Col(j) associated with the pixel P(i,j), which converts this value into a voltage. The column Col(j) is connected to the source of the transistor T(i,j). Charge integration in each column is managed by column addressers.

The propagation of the selection token from the row L(i) to the next row L(i+1) is managed by a row-addressing device, or row scanner, commonly referred to as a "row driver" or "gate driver". The row-addressing device is a shift register, comprising a plurality of stages. Each stage is connected to a row of the array. A signal generator, which generates two clock signals that are phase-shifted relative to one another, is connected to the addressing device. On each clock pulse, the selection token propagates through the addressing device, passing from one stage to another.

Row-addressing devices were initially arranged outside of the array, connected to the array for example by flexible layers. Row-addressing devices implemented directly in the array, using single n-type or p-type TFT transistors, have appeared more recently. The array may be formed by depositing layers on a substrate, for example of amorphous silicon (a-Si), TFT, polycrystalline silicon, organic semiconductor or amorphous gallium indium zinc oxide (Ga2O3-In2O3-ZnO) type.

These addressing devices integrated into the array, commonly referred to as GOAs (gate drivers on array), make it possible to save on manufacturing costs and footprint, and make it possible to limit connection errors in comparison with external addressing devices.

FIG. 2 illustrates a circuit diagram showing two consecutive stages of a matrix-addressing device. The two stages shown correspond to stages driven by two different clock signals, namely a first clock signal CK1 and a second clock signal CK2. In the present application, a stage driven by the first clock signal CK1 will be referred to as the "odd stage" and a stage driven by the second clock signal CK2 will be referred to as the "even stage", as is convention. FIG. 2 therefore illustrates a circuit diagram of an odd stage and of an even stage. Each stage is connected to a row comprising a plurality of pixels, as described above.

Each stage comprises an output row that outputs an activation signal (Out2n+1, Out2n+2). The stage comprises an output transistor TFT4, which transmits a pulse of a clock signal at the output of the stage. The gate of the output transistor TFT4 may be connected to an internal node NI of the stage, its drain may be connected to the output Out2n+2 and its source may receive the signal from a first clock CK1. A boost capacitor C_SRFD may be connected between the gate and the source of the output transistor of the input stage TFT4. A first control transistor for the stage TFT1 (pull-up transistor) is capable of pre-charging the gate of the output transistor TFT4. The drain of the first control transistor TFT1 is thus connected to the gate of the output transistor TFT4. The gate and the source of the first control transistor TFT1 are controlled by the output of the preceding stage (stage 2n). For the first stage of the addressing device, the gate and the source of the first control transistor TFT1 are controlled by the signal generator GSI, which generates a pulse STV.

The signal generator GSI may comprise a dedicated circuit, for example an FPGA circuit, coupled to a level converter. The FPGA receives control signals transmitted by a calculation device (not shown). The FPGA generates the logic signals at a low voltage (for example between 0 and 3.3 V). The level converter ensures that the low voltages of the FPGA and the higher voltages of the array (Von, Voff) are compatible.

A second control transistor TFT3 is capable of discharging the gate of the output transistor TFT4. The drain of the second control transistor TFT3 is thus connected to the gate of the output transistor TFT4.

A discharge transistor TFT5 (pull-down transistor) may be connected to the output of the stage Out2n+1. The gate of the discharge transistor TFT5 is connected to the gate of the second control transistor TFT3; it is also connected to the output signal Out2n+2 of the next stage.

The token thus propagates from stage to stage until all of the rows of the array have been read.

Document US 2013/0088265 A1 describes another example of a GOA.

The principle according to which rows are addressed in displays and in detectors is substantially the same. Specifically, two different clock signals (first signal CK1 and second signal CK2) drive the output transistor, alternating from one stage to another. The variation in voltage between the high level and the low level of the clock signals may reach several tens of volts. This sharp variation results in parasitic signals, due to the capacitance of the gate, with peaks that may reach a value of several volts at the output of the stage on each rising edge and on each falling edge of the clock signal delivered to the stage (CK1 for the odd stages, CK2 for the even stages).

Thus, at each stage, even when the token is not propagating through the stage (and hence with an output transistor TFT4 that is off), parasitic coupling occurs between the clock signal, which arrives at the source of the output transistor TFT4, and the row leading to the pixels. Similarly, at the transistor T(2n+1) of the pixel P(2n+1), the capacitive effect of the gate results in parasitic signals on the column. These various parasitic couplings (clock/row and row/column) are represented physically in FIG. 2 by the capacitances Ca and Cb, respectively.

The coupling due to the first clock signal CK1 is found in all of the rows that are connected to the first clock signal CK1. In a matrix-array detector with two thousand rows, during the charge integration at each column, the coupling due to the first clock signal CK1 is therefore multiplied by a thousand. The same applies for the coupling due to the second clock signal CK2.

In the field of displays, these parasitic couplings do not present any difficulties, given that a voltage, corresponding to the signal of data to be displayed, is applied at each column. However, in the field of detectors, given the small amount of charge of the useful signal, the values of the parasitic couplings may substantially exceed the value of the signals to be detected. Typically, the values of the parasitic couplings may reach two or three hundred times the value of the useful signal. The presence, on one and the same column, of parasitic charge exhibiting different values from one row to another prevents corrective processing from being performed that would distinguish between parasitic charge arising from the even rows and parasitic charge arising from the odd rows. In the present application, the term "odd-even effect" is used to refer to having, in the columns, parasitic signals resulting from different clock signals (some signals on the even rows, others on the odd rows).

SUMMARY OF INVENTION

One object of the invention is therefore to provide a matrix-array detector allowing the odd-even effect to be decreased. Another object of the invention is to provide a matrix-array detector exhibiting decreased parasitic noise.

A subject of the invention is therefore a matrix-array detector comprising:
an array of pixels arranged in a matrix along rows and down columns, each pixel being capable of generating a signal according to a physical effect;
a signal generator configured to generate two clock signals that are phase-shifted relative to one another;
a row-addressing device comprising a shift register, the shift register comprising a plurality of stages arranged in a cascade, each stage being capable of receiving, in alternation from one stage to the another, one clock signal from the two clock signals, and being capable of delivering an intermediate output signal that is able to take a high value and a low value allowing the pixels of the row to be activated and to be deactivated, respectively,
characterized in that the signal generator is also configured to generate a third clock signal, the addressing device also comprising a plurality of isolation circuits, each isolation circuit being connected between each stage and the corresponding row of the matrix, and configured to receive the third clock signal, the isolation circuit being configured to deliver a selection signal for selecting the corresponding row of the matrix when the intermediate output signal and the third clock signal are at the high level.

Advantageously, the isolation circuit comprises an input terminal capable of receiving the intermediate output signal, an output terminal configured to deliver the selection signal, a first transistor referred to as an isolation transistor, the gate of which is connected to the input terminal via a diode-connected transistor, the drain of which is connected to the output terminal and the source of which is connected to receive the third clock signal, and a boost capacitor that is arranged between the gate and the source of the first isolation transistor.

Advantageously, the isolation circuit comprises a second transistor referred to as an isolation transistor configured to isolate the output terminal from the boost capacitor when it is off.

Advantageously, the isolation circuit comprises an impedance-lowering circuit connected between the gate of the first isolation transistor and the output terminal, and configured to maintain the potential of the row at the low level when the selection signal is at the low level.

Advantageously, the impedance-lowering circuit comprises:
a first transistor of the impedance-lowering circuit, the source of which is connected to the drain of the first isolation transistor, the drain of which is connected to a voltage source corresponding to the low level and the gate of which is connected to the gate of the first isolation transistor;
a second transistor of the impedance-lowering circuit, the source and the gate of which are connected to the gate of the first isolation transistor and the drain of which is connected to the voltage source corresponding to the low level; and
a third transistor of the impedance-lowering circuit, controlled by a first control signal delivered by the signal generator and the source of which is connected to the gate of the first isolation transistor.

Advantageously, each stage comprises a first reset transistor configured to deactivate the pixels of all of the rows simultaneously, the gate of which is controlled by a pulse of a reset signal delivered by the signal generator.

Advantageously, each isolation circuit comprises a second reset transistor configured to activate the pixels of all of the rows simultaneously, the gate of which is controlled by the pulse of the reset signal and the drain of which is capable of receiving a second control signal.

BRIEF DESCRIPTION OF DRAWINGS

The appended drawings illustrate the invention.

DESCRIPTION OF EMBODIMENTS

Figure 1:
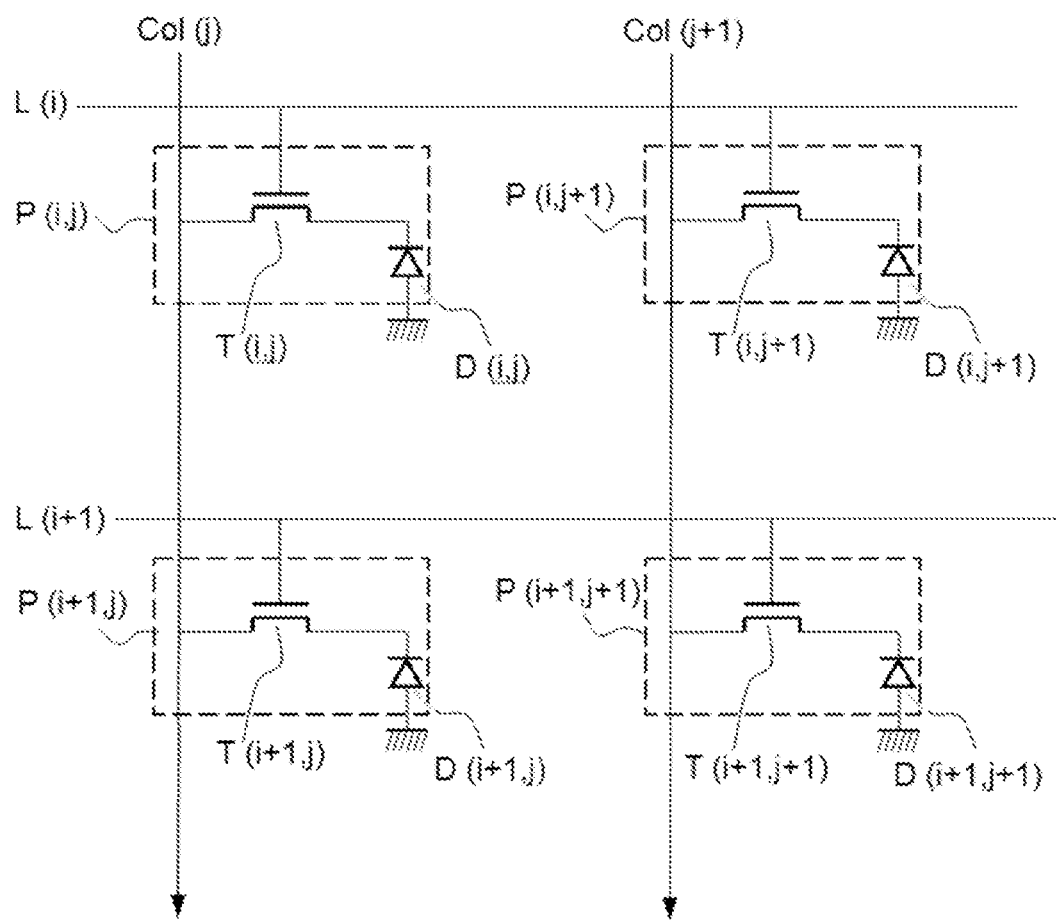
FIG. 1, described above, shows the arrangement of pixels in rows and in columns according to the prior art.
Figure 2:
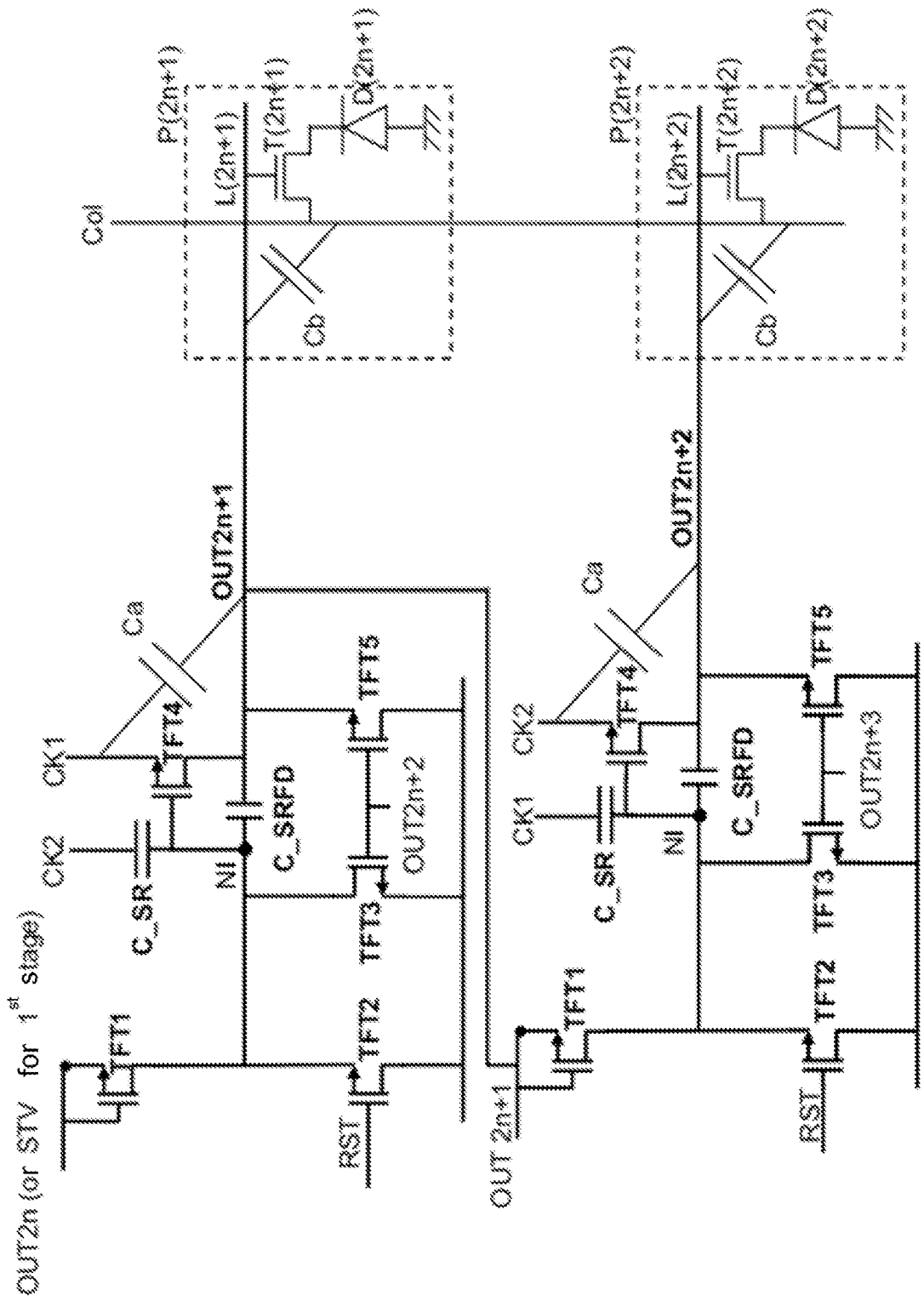
FIG. 2, described above, shows the circuit diagram of two stages of a shift register according to the prior art.
Figure 3:
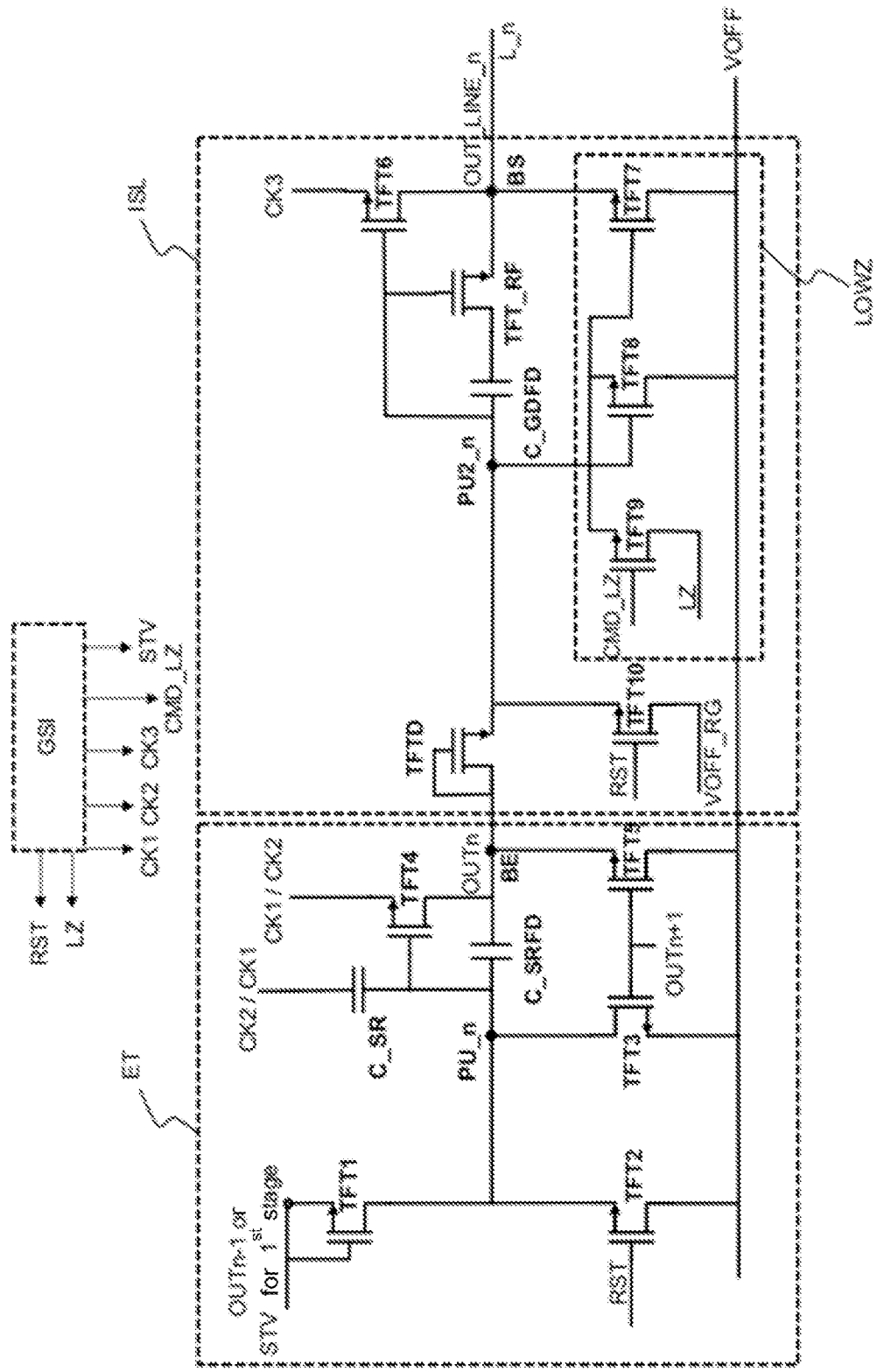
FIG. 3 shows the circuit diagram of one stage and of an isolation circuit according to the invention.

FIG. 3 shows the circuit diagram of a stage ET of the addressing device, such as described above. The stage corresponds to a row L_n, which may equally be an even row or an odd row. The source of the output transistor TFT4 receives a clock signal; as is convention, the output transistor TFT4 of an odd row is defined as that which receives, at its source, the first clock signal CK1, and the output transistor TFT4 of an even row is defined as that which receives, at its source, the second clock signal CK2.

A compensation capacitor C_SR may be arranged between the other clock signal (CK2 if the source of the output transistor TFT4 receives CK1, and vice versa) and the gate of the output transistor TFT4. The value of the compensation capacitor C_SR is preferably equivalent to that of the parasitic capacitance found between the gate and the source of the output transistor TFT4. As a variant, the compensation capacitor C_SR may be replaced with a transistor. The size of the transistor replacing the compensation capacitor C_SR is in this case equal to half of that of the output transistor TFT4. Thus, the total capacitance is equivalent to the capacitance between the gate and the source of the output transistor TFT4 (TFTs generally being perfectly symmetrical).

Figure 4:
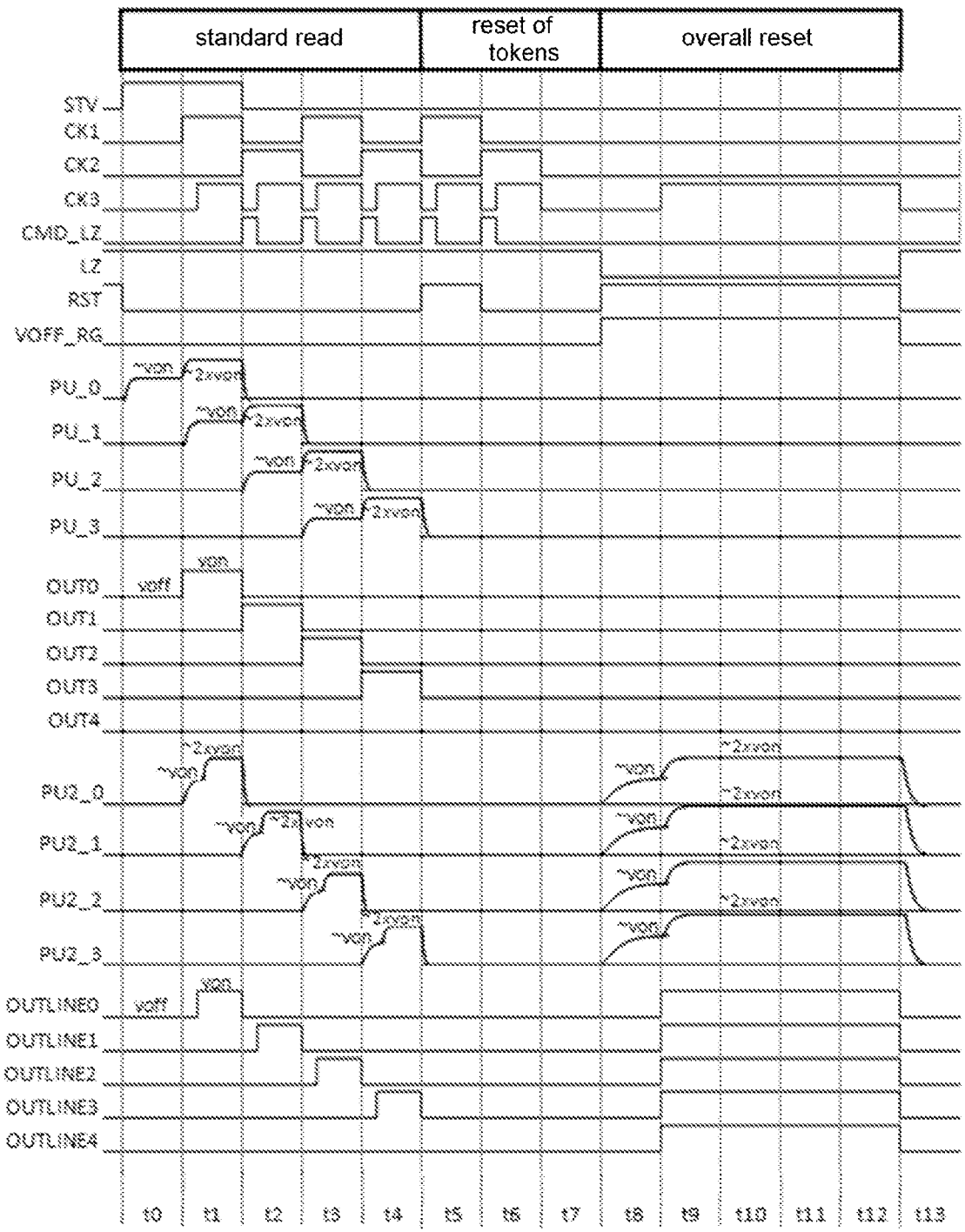
FIG. 4 shows a timing diagram illustrating the operation of the row-addressing device according to the invention.

FIG. 4 shows a timing diagram, illustrating in particular the operation of the four first stages ET of the addressing device (under the column "standard read").

PU_n is defined as being the first internal node of the stage ET, connected between the drain of the first control transistor TFT1 and the gate of the output transistor TFT2. In FIG. 4, the signal PU_n corresponds to the voltage between the first internal node PU_n and the reference voltage Voff. An input terminal BE is also defined, this being connected between the drain of the output transistor TFT4 and the source of the discharge transistor TFT5. The input terminal BE is configured to receive an intermediate output signal OUT_n. The intermediate output signal OUT_n may take a high value Von, which corresponds to a voltage that is sufficient to turn on all of the transistors of the pixels of the corresponding row, or a low level, to turn them off.

With reference to FIG. 4, at time t0, the first control transistor TFT1 for the stage ET0 receives an input pulse STV (voltage Von) generated by a signal generator GSI. The first control transistor for the stage TFT1 is therefore on, and charges the boost capacitor C_SRFD. The potential of the first internal node PU_0 rises until reaching the voltage Von, from which it is necessary to subtract the threshold voltage (VTFT1) of the first control transistor for the stage TFT1.

At time t1, the source of the output transistor TFT4 receives a clock pulse of the first clock signal CK1. Since the first internal node PU_0 has been charged to the precharge voltage level Von-VTFT1, the output transistor TFT4 is on. The first clock signal CK1 is at the high level Von, the source of the output transistor TFT4 follows, bringing with it the gate of the output transistor TFT4, which is floating, by virtue of the boost capacitor C_SRFD. The voltage of the first internal node PU_0 transitions to 2×Von, the output transistor TFT4 is then substantially on, and the intermediate output signal Out0 follows the first clock signal CK1 perfectly, until it falls at time t2. The first control transistor TFT1 of the next stage receives, at time t1, the intermediate output signal Out0 of the preceding stage.

The addressing device also comprises an isolation circuit ISL. The isolation circuit ISL is connected between each stage ET and the corresponding row LI of the matrix. The isolation circuit ISL receives the intermediate output signal Outn and a third clock signal CK3. The principle of the invention consists in applying the same clock signal CK3 to all of the isolation circuits ISL that are connected to the rows of the matrix. The clock signal CK3 is a periodic signal, the high level of which repeats each time the first clock signal CK1 and the second clock signal CK2 transition to the high level.

The isolation circuit ISL is configured to provide a selection signal OUT_LINE_n to the corresponding row L_n of the matrix. The selection signal OUT_LINE_n may transition from a high level (voltage Von) allowing the pixels of the row to be selected so that detected charge is read, to a low level (voltage Voff). The selection signal OUT_LINE_n is delivered by an output terminal BS connected to the row L_n.

The isolation circuit ISL comprises a first isolation transistor TFT6. The source of the first isolation transistor TFT6 receives the third clock signal CK3. The first isolation transistor TFT6 thus allows the token transmitted by the stage ET to be passed on when the third clock signal CK3 is at Von. A boost capacitor C_GDFD, which allows the "bootstrap" effect to be obtained, is connected both to the gate of the first isolation transistor TFT6 and to the output terminal BS. Additionally, a diode-connected transistor TFTD, the gate of which is connected to the drain, is arranged between the input terminal BE and the gate of the first isolation transistor TFT6. The diode-connected transistor TFTD allows only the positive voltages to pass. The node located between the source of the diode-connected transistor TFTD and the gate of the first isolation transistor TFT6.

The operation of the isolation circuit is described in conjunction with FIG. 4. At time t1, the intermediate output signal OUT_0 is at Von. The diode-connected transistor TFTD is therefore on and charges the booster capacitor C_GDFD for as long as the third clock signal CK3 is at Voff. The potential of the second internal node PU2_0 rises until reaching the voltage Von, from which it is necessary to subtract the threshold voltage (VTFTD) of the diode-connected transistor TFTD. The first isolation transistor TFT6 is then substantially on.

When the third clock signal CK3 transitions to Von, the charging of the second internal node PU2_0 to the precharge voltage Von-VTFTD turns the first isolation transistor TFT6 on. The drain of the first isolation transistor TFT6 follows, bringing with it the gate of the first isolation transistor TFT6, which is floating, by virtue of the boost capacitor C_GDFD. The voltage of the second internal node PU2_0 transitions to 2×Von, the first isolation transistor TFT6 is then substantially on, and the selection signal OUT_LINE_0 transitions to Von.

In the same way, by propagating the token through the successive stages of the shift register, at time t2, the detection signal OUT_LINE_1 transitions to Von when the third clock signal CK3 is at Von.

The duty cycle of the third clock signal CK3, i.e. the ratio, over one period, between the time at Von and the time at Voff, may be determined so that there is time for the second internal node PU2_n to rise to Von while still keeping the time at Von as long as possible, since it is when the third clock signal CK3 is at Von that the matrix is read. The duty cycle may therefore be determined according to the switching speed of the TFTs of the addressing device. The duty cycle may, for example, be determined by simulation, according to the values of the various components of the addressing device.

The odd-even effect, present at the input terminal BE, is substantially decreased at the output terminal BS by virtue of the third clock signal CK3 which is common to all of the rows of the matrix.

According to one particularly advantageous embodiment, a second isolation transistor TFT_RF is arranged between the boost capacitor C_GDFD and the output terminal BS. The gate of the second isolation transistor TFT_RF is connected to the gate of the first isolation transistor TFT6.

The second isolation transistor TFT_RF makes it possible to isolate the parasitic coupling still present in the boost capacitor C_GDFD. The second isolation transistor TFT_RF and the first isolation transistor TFT6 are controlled by the same signal. Thus, the second isolation transistor TFT_RF is on when the token is propagating through the isolation circuit ISL, and off for the rest of the time. The second isolation transistor TFT_RF isolates the boost capacitor C_GDFD except when the row has to be activated. The second isolation transistor TFT_RF also comprises a parasitic capacitance, but its value is substantially lower than that of the boost capacitor C_GDFD.

According to another embodiment, the isolation circuit ISL comprises an impedance-lowering circuit LOWZ connected between the gate of the first isolation transistor TFT6 and the output terminal BS. The impedance-lowering circuit LOWZ allows the potential of the row L_n to be maintained at Voff when the selection signal OUT_LINE_n is at Voff. By maintaining the potential of the row at Voff when the token is not propagating through the stage, what remains of the parasitic coupling is eliminated.

The impedance-lowering circuit LOWZ also makes it possible to prevent the transistors of the pixels from being permanently biased, which would result in them ageing more quickly. It also makes it possible to prevent parasitic tokens from arising, caused by drift in the transistors.

The impedance-lowering circuit LOWZ comprises a first transistor of the impedance-lowering circuit TFT7, the source of which is connected to the drain of the first isolation transistor TFT6, the drain of which is connected to the voltage Voff and the gate of which is connected to the gate of the first isolation transistor TFT6. It also comprises a second transistor of the impedance-lowering circuit TFT8, the source and the gate of which are connected to the gate of the first isolation transistor TFT6 and the drain of which is connected to the voltage Voff. Lastly, it comprises a third transistor of the impedance-lowering circuit TFT9, controlled by a first control signal CMD_LZ delivered by the signal generator GSI and the source of which is connected to the gate of the first transistor of the impedance-lowering circuit TFT7 and to the source of the second transistor of the impedance-lowering circuit TFT8.

When the second internal node PU2_n transitions to Von, which corresponds to the arrival of a token from the stage ET, the second transistor of the impedance-lowering circuit TFT8 turns on and thus allows Voff to pass. The first transistor of the impedance-lowering circuit TFT7 therefore turns off, hence it no longer imposes Voff at the output terminal BS, hence the token may pass and the row may be addressed.

In the absence of a token arriving from the stage ET, the second internal node PU2_n remains in the state Voff, the second transistor of the impedance-lowering circuit TFT8 remains off and the gate of the first transistor of the impedance-lowering circuit TFT7 remains at Von; the latter remains on and imposes Voff on the row.

The first control signal CMD_LZ allows the third transistor of the impedance-lowering circuit TFT9 not to be permanently at Von. Specifically, the control signal LZ, which arrives at the drain of the third transistor of the impedance-lowering circuit TFT9, is permanently at Von. The first control signal CMD_LZ may therefore have a duty cycle that is preferably reversed with respect to that of the third clock signal CK3: it is mainly at Voff except for a short time when it transitions to Von, as illustrated in the timing diagram in FIG. 4.

The gate potential of the first transistor of the impedance lowering circuit TFT7 therefore returns regularly (each time a row is addressed) to Von and ensures that the first transistor of the impedance-lowering circuit TFT7 is on as long as the second internal node PU2_n does not transition to Von. The gate of the first transistor of the impedance-lowering circuit TFT7 is not kept permanently at Von by virtue of the first control signal CMD_LZ; this allows the second transistor of the impedance-lowering circuit TFT8 to easily switch the gate of the first transistor of the impedance-lowering circuit TFT7 to Voff when the second internal node PU2_n is at Von. This also makes it possible to avoid potential short circuits caused by an on state both of the second transistor of the impedance-lowering circuit TFT8 and of the third transistor of the impedance-lowering circuit TFT9.

The matrix-array detector thus makes it possible to obtain one and the same parasitic effect for all of the rows of the matrix which may be corrected using known techniques, for example by taking a blank image before the detection step.

Advantageously, each stage ET may also comprise a reset transistor for the stage TFT2, the gate of which is controlled by a pulse of a reset signal RST. The drain of the reset transistor TFT2 is connected to the source of the second control transistor TFT3 and to the drain of the discharge transistor TFT5. The source of the reset transistor TFT2 may be connected to the drain of the second control transistor for the input stage TFT3.

With reference to FIG. 4 (under the column "reset of tokens"), a pulse of the reset signal RST is received at the gate of the reset transistor for the stage TFT2. Thus, a reset pulse allows the various transistors comprised in the stage ET to be turned off immediately.

According to one preferred embodiment, each isolation circuit ISL comprises a second reset transistor TFT10 configured to activate the pixels of all of the rows simultaneously. The gate of the second reset transistor TFT10 is controlled by the pulse of the reset signal RST, and the drain is capable of receiving a second control signal Voff_RG.

FIG. 4 (under the column "overall reset") makes it possible to understand the usefulness of the second reset transistor TFT10, controlled by a control signal.

In standard operation, Voff_RG=Voff, which makes it possible to have a diagram equivalent to the preceding one with the reset function remaining unchanged. Thus, all of the transistors of the isolation circuit ISL turn off.

When an overall reset has to be performed, the following commands are applied: Voff_RG=Von, RST=Von and LZ=Voff.

The stage ET is then reset by the command RST, as mentioned above. At t8, the second internal node PU2_n rises to Von on all of the rows at the same time (the command LZ is deactivated, LZ=0). Then, at t9, the third clock signal CK3 is set to Von, to raise all of the selection signals to Von.

Next, by imposing Voff_RG=Voff and LZ=Von, at t13, all of the stages of the GOA will return to Voff and the electronics may be turned off.

This overall reset function is particularly advantageous in terms of power consumption. When using a sensor in a non-constant manner, for example for fingerprint recognition on an electronic device using the matrix-array detector, it is necessary to monitor the power consumed. For example, the recognition function is used about 0.1% of the time at most. It is therefore necessary to turn off the read electronics during dead times.

Read electronics may consume about 500 mW when taking an image, i.e. 135 mA at the 3.7 V of a telephone (smartphone) battery, which is a consumption of about 10% of the battery if it is not turned off.

However, turning off the power supply of a photodiode matrix array for a very long time means that the wakeup time will be very long (a few seconds) due to the fact that unbiased photodiodes are in a very different state with respect to a biased photodiode and several tens of images are required to stabilize the matrix.

The overall reset function, made possible by the presence of a third clock signal CK3, makes it possible to maintain the positive bias voltage for biasing the photodiodes and to regularly reset the photodiodes so as to permanently maintain a stable state.

The invention claimed is:

1. A matrix-array detector comprising:
an array of pixels arranged in a matrix along rows and down columns, each pixel being capable of generating a signal according to a physical effect;
a signal generator configured to generate two clock signals that are phase-shifted relative to one another;
a row-addressing device comprising a shift register, the shift register comprising a plurality of stages arranged in a cascade, each stage being capable of receiving, in alternation from one stage to another, one clock signal from the two clock signals, and being capable of delivering an intermediate output signal that is able to take a high value and a low value allowing the pixels of the row to be activated and to be deactivated, respectively,
the signal generator also being configured to generate a third clock signal, the addressing device also comprising a plurality of isolation circuits, each isolation circuit being connected between each stage and the corresponding row of the matrix, and configured to receive the third clock signal, the isolation circuit being configured to deliver a selection signal for selecting the corresponding row of the matrix when the intermediate output signal and the third clock signal are at the high level,
wherein the isolation circuit comprises an input terminal capable of receiving the intermediate output signal, an output terminal configured to deliver the selection signal, a first transistor referred to as an isolation transistor, the gate of which is connected to the input terminal via a diode-connected transistor, the source drain of which is connected to the output terminal and the source of which is connected to receive the third clock signal, and a boost capacitor that is arranged between the gate and the source drain of the first isolation transistor, characterized in that the isolation circuit comprises a second transistor referred to as an isolation transistor configured to isolate the output terminal from the boost capacitor when it is off.

2. The matrix-array detector according to claim 1, wherein the isolation circuit comprises an impedance-lowering circuit connected between the gate of the first isolation transistor and the output terminal, and configured to maintain the potential of the row at the low level when the selection signal is at the low level.

3. The matrix-array detector according to claim 2, wherein the impedance-lowering circuit comprises:
a first transistor of the impedance-lowering circuit, the source of which is connected to the drain of the first isolation transistor, the drain of which is connected to a voltage source corresponding to the low level and the gate of which is connected to the gate of the first isolation transistor;
a second transistor of the impedance-lowering circuit, the source of which is connected to the gate of the first transistor of the impedance-lowering circuit, the gate of which is connected to the gate of the first isolation transistor and the drain of which is connected to the voltage source corresponding to the low level; and
a third transistor of the impedance-lowering circuit, controlled by a first control signal delivered by the signal generator, the gate of which is connected to the gate of the first transistor of the impedance-lowering circuit to the gate of the first isolation transistor.

4. The matrix-array detector according to claim 3, wherein each stage comprises a first reset transistor configured to deactivate the pixels of all of the rows simultaneously, the gate of which is controlled by a pulse of a reset signal delivered by the signal generator.

5. The matrix-array detector according to claim 4, wherein each isolation circuit comprises a second reset transistor configured to activate the pixels of all of the rows simultaneously, the gate of which is controlled by the pulse of the reset signal and the source drain of which is capable of receiving a second control signal.

* * * * *